US010549989B2

(12) United States Patent
Shichi et al.

(10) Patent No.: US 10,549,989 B2
(45) Date of Patent: Feb. 4, 2020

(54) MICROSTRUCTURE MANUFACTURING METHOD AND ION BEAM APPARATUS

(71) Applicant: Hitachi, Ltd., Chiyoda-ku, Tokyo (JP)

(72) Inventors: Hiroyasu Shichi, Tokyo (JP); Keiji Watanabe, Tokyo (JP); Daisuke Ryuzaki, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 70 days.

(21) Appl. No.: 15/932,194

(22) Filed: Feb. 16, 2018

(65) Prior Publication Data

US 2018/0244517 A1     Aug. 30, 2018

(30) Foreign Application Priority Data

Feb. 24, 2017  (JP) ................. 2017-033185

(51) Int. Cl.
| | | |
|---|---|---|
| *B81C 1/00* | (2006.01) | |
| *H01L 21/687* | (2006.01) | |
| *H01J 27/02* | (2006.01) | |
| *H01J 37/305* | (2006.01) | |
| *H01J 37/30* | (2006.01) | |

(52) U.S. Cl.
CPC ...... *B81C 1/00341* (2013.01); *B81C 1/00626* (2013.01); *H01J 27/022* (2013.01); *H01J 37/3005* (2013.01); *H01J 37/3056* (2013.01); *H01L 21/68714* (2013.01); *B81C 2201/0132* (2013.01); *H01J 2237/31749* (2013.01)

(58) Field of Classification Search
CPC ............ B81C 1/00341; B81C 1/00388; B81C 1/00436; B81C 1/00444; B81C 1/00547; H01J 37/30; H01J 37/3002; H01J 37/3007; H01J 37/305; H01J 37/3053; H01J 37/3056
USPC .................. 250/423 R, 424, 425, 426, 492.3
See application file for complete search history.

(56) References Cited

U.S. PATENT DOCUMENTS

| | | | |
|---|---|---|---|
| 6,822,245 B2 | 11/2004 | Muto et al. | |
| 2002/0008208 A1* | 1/2002 | Muto ..................... | H01J 37/28 250/423 R |
| 2010/0308237 A1* | 12/2010 | Numata ........... | B29D 11/00432 250/492.3 |

FOREIGN PATENT DOCUMENTS

| | | |
|---|---|---|
| JP | 9-186138 A | 7/1997 |
| JP | 2002-33070 A | 1/2002 |
| JP | 2010-45000 A | 2/2010 |

* cited by examiner

*Primary Examiner* — Jason L McCormack
(74) *Attorney, Agent, or Firm* — Crowell & Moring LLP

(57) ABSTRACT

A sufficient processing speed and sufficient processing accuracy are obtained in a microstructure manufacturing method using ion beams. The microstructure manufacturing method includes the steps of: (a) irradiating a first region of a sample with a first ion beam (projection ion beam) formed by being passed through a first opening portion of a first mask, and etching the sample; and (b) irradiating a second region that is wider than the first region in a direction along a beam width, with a second ion beam (projection ion beam), and processing the sample. Furthermore, a magnitude of a skirt width of a longitudinal section of the second ion beam is smaller than a magnitude of a skirt width of a longitudinal section of the first ion beam.

7 Claims, 10 Drawing Sheets

6: PROJECTION ION BEAM

MICROSTRUCTURE MANUFACTURING METHOD AND ION BEAM APPARATUS

CROSS-REFERENCE TO RELATED APPLICATION

The present application claims priority from Japanese Patent Application No. 2017-33185 filed on Feb. 24, 2017, the content of which is hereby incorporated by reference to this application.

BACKGROUND OF THE INVENTION

1. Field of the Invention

The present invention relates to a microstructure manufacturing method and an ion beam apparatus.

2. Description of the Related Art

Irradiating a sample with an ion beam enables the sample to be microprocessed by sputtering. There is known, for example, a focused ion beam (hereinafter, also referred to as "FIB") apparatus using a liquid metal ion source (hereinafter, also referred to as "LMIS") as an ion beam apparatus. The sample can be also processed by generating gas ions such as oxygen, nitrogen, argon, krypton, or xenon ions by a plasma ion source or a gas field ion source, and then irradiating the sample with the ion beam. When the sample is irradiated with, in particular, ion species having a large mass such as krypton, xenon, gallium, or indium, the number of sample atoms sputtered per ion irradiation increases to appropriately process the sample. Furthermore, it is possible to increase a processing speed when the sample is irradiated with an ion beam while reactive etching gas is supplied to a surface of the sample. Moreover, it is possible to form a membrane on the sample when the sample is irradiated with an ion beam while deposition gas is supplied to the sample.

For example, JP-1997-186138-A discloses a shaped ion beam. Using a projection ion beam apparatus for shaping an ion beam with a stencil mask and then irradiating the sample with the ion beam enables high current processing. In addition, JP-1997-186138-A discloses a technique for correcting a misalignment between a focused ion beam for observation and a shaped ion beam for processing.

Furthermore, JP-2002-033070-A discloses an ion beam technique for two types of ion beams, that is, a focused ion beam at a high image resolution and an ion beam for edge processing capable of processing a sectional edge portion sharply.

Moreover, JP-2010-045000-A discloses high speed processing on an electron microscope sample and a high accuracy processing technique.

SUMMARY OF THE INVENTION

In recent years, the ion beam processing technique has attracted attention as a manufacturing technique for a microstructure, for example, micro electromechanical systems (MEMS) of a sensor, an actuator, an electronic circuit, and the like. However, manufacturing the microstructure such as the MEMS by an ion beam has the following problems to solve.

When a projection ion beam apparatus is used, it is possible to irradiate a sample with a high current ion beam. Sensor MEMS were, thus, prototyped using a projection ion beam. However, measured device characteristics of the sensor MEMS matching design estimated device characteristics could not be obtained. Precisely measuring a dimension of the manufactured device indicated that the dimension was slightly different from a design dimension.

In other words, it is particularly important to improve two-dimensional dimension accuracy in a plane and perpendicular processing accuracy in a depth direction for obtaining desired device characteristics in the manufacturing of the microstructure such as the MEMS. In a case of irradiating a sample with a projection ion beam, the sample is irradiated with a shaped ion beam having a dimension obtained by multiplying a dimension of a stencil mask by a magnification of a projection optical system. Owing to this, a stencil mask having the dimension obtained by dividing a design dimension of a microstructure by the magnification of the projection optical system was prepared to perform processing. However, when a rectangular hole, for example, was formed in the sample by this processing, it was found that a dimension of an upper portion of an opening portion of the hole was larger than the design dimension. It was also found that a dimensional difference was generated between the upper portion and a lower portion of the opening portion of the hole. Owing to this, desired device characteristics could not be obtained; in such a case, a technique for forming a fine focused ion beam and additionally processing a periphery of the opening portion is adopted.

However, this method has problems that it takes time for processing and yet it takes long time for matching a processing dimension to the design dimension. It is particularly difficult to irradiate only tilted portions on the periphery of the opening portion with the ion beam, so that a bottom portion of the hole is not formed flat to disadvantageously generate irregular portions. Furthermore, a problem occurs that it is impossible to attain sufficiently high processing accuracy relative to the design dimension.

An object of the present invention is to provide a technique for manufacturing a microstructure using ion beams, in which it is possible to obtain a sufficient processing speed and sufficient processing accuracy.

The object and novel features of the present invention will be readily apparent from description of the present specification and accompanying drawings.

An outline of a typical embodiment among embodiments disclosed in the present application will be briefly described as follows.

A microstructure manufacturing method according to one embodiment includes a step (a) of irradiating a first region of a sample with a first ion beam formed by being passed through a first opening portion of a first mask, and etching the sample. The microstructure manufacturing method also includes a step (b) of irradiating a second region that includes at least part of or entirety of the first region etched in the step (a) and that is wider than the first region in a direction along a beam width, with a second ion beam, and processing the sample. Furthermore, a magnitude of a skirt width of a longitudinal section of the second ion beam is smaller than a magnitude of a skirt width of a longitudinal section of the first ion beam.

Another microstructure manufacturing method according to one embodiment includes a step (a) of irradiating a sample with a first ion beam formed by being passed through an opening portion of a third mask having the opening portion formed into a recessed polygon, and forming a region at a first depth and a region at a second depth smaller than the first depth in the sample. Another microstructure manufacturing method also includes a step (b) of irradiating the region at the second depth with a second ion beam formed by being passed through an opening portion of a fourth mask, and processing the sample, in which the opening portion of the fourth mask is formed from part of a shape of the recessed polygon.

An ion beam apparatus includes: an ion source; a plurality of lenses that focus an ion beam emitted from the ion source; a stage that holds a sample; and a mask that is disposed on the sample and that has an opening portion. The sample is irradiated with an ion beam formed by being passed through the opening portion of the mask to process the sample. The ion beam apparatus further includes a control section that exercises first control for irradiating the sample with a first ion beam to etch the sample, second control for forming a second ion beam having a magnitude of a skirt width of a longitudinal section smaller than a magnitude of a skirt width of a longitudinal section of the first ion beam, and third control for irradiating a region wider than a region irradiated with the first ion beam in a direction along a beam width, with the second ion beam to etch the sample.

Effects obtained by a typical aspect among aspects of the invention disclosed in the present application will be briefly described as follows.

It is possible to obtain a sufficient processing speed and sufficient processing accuracy when a microstructure is manufactured using ion beams.

DESCRIPTION OF THE PREFERRED EMBODIMENTS (First Embodiment)

Figure 1:
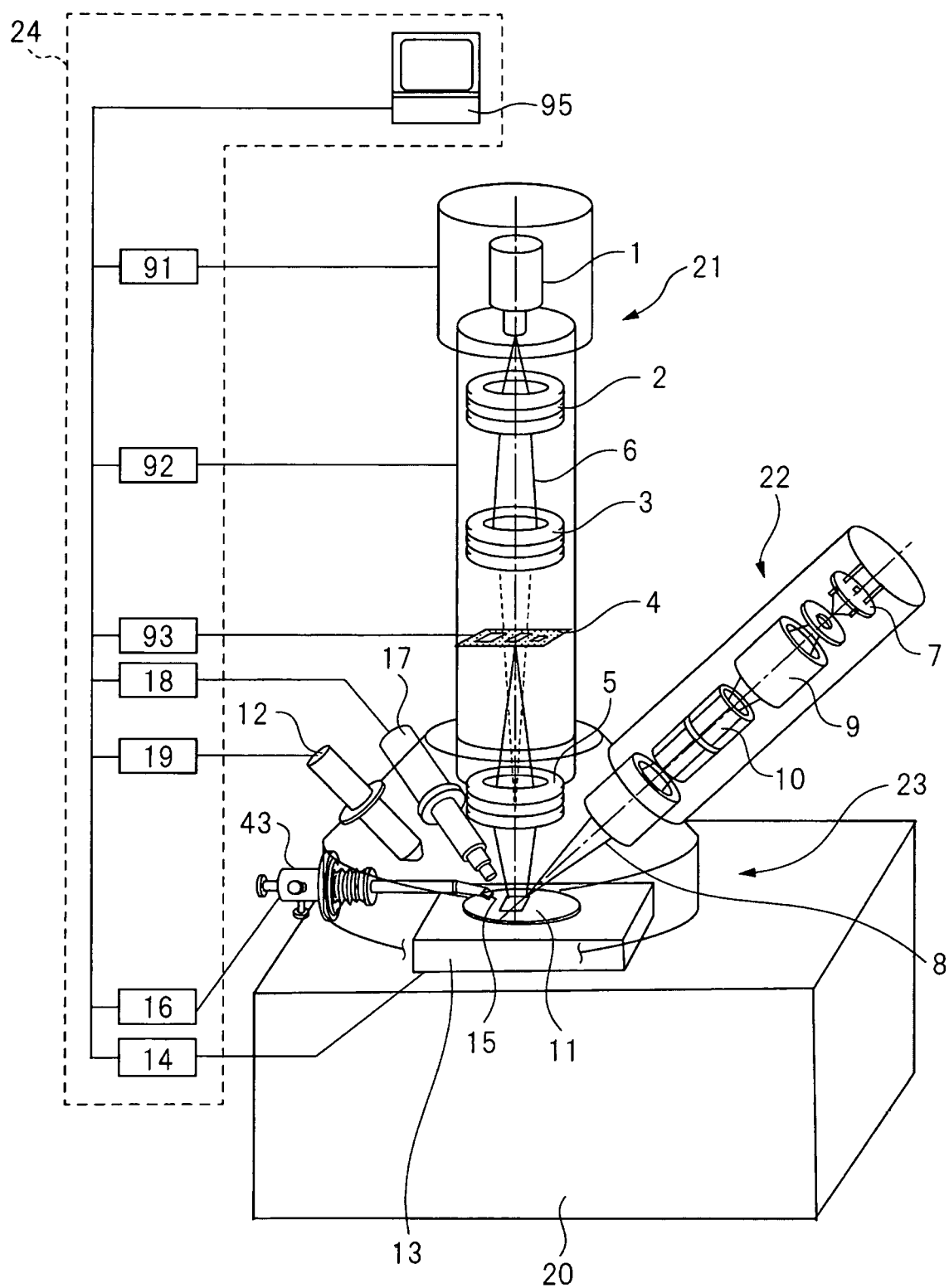
FIG. 1 is a schematic configuration diagram showing an example of an ion beam apparatus according to a first embodiment of the present invention.

FIG. 1 is a schematic configuration diagram showing an example of an ion beam apparatus according to a first embodiment of the present invention.

A first example of a microstructure manufacturing method and an ion beam apparatus according to the first embodiment will be described with reference to FIG. 1. In the first embodiment, a projection ion beam apparatus will be described as an example of the ion beam apparatus.

In the projection ion beam apparatus, a stencil mask having an opening portion of a predetermined shape is inserted into halfway along an ion beam irradiation system, and a sample is irradiated with an ion beam formed into the shape of the opening portion. In addition, as an ion source, a plasma ion source that extracts an ion beam of a gaseous element such as inert gas, oxygen, or nitrogen is used. While a duoplasmatron ion source, a Penning ion source, a multi-cusp ion source, an inductively coupled plasma (hereinafter, also referred to as "ICP") ion source, or the like is applicable as the plasma ion source, the other ion source is also applicable. In the first embodiment, a case of using the ICP ion source as the ion source will now be described.

The ion beam apparatus shown in FIG. 1 includes a plasma ion source 1 that is an ion source, a plurality of (three or more in this example) lenses for focusing an ion beam emitted from the plasma ion source 1, a movable stage 13 that holds a sample 11, and a stencil mask 4 that is a mask disposed on the sample 11 and having an opening portion. The ion beam apparatus irradiates the sample 11 with the ion beam formed by being passed through the opening portion of the stencil mask 4 to process the sample 11.

A configuration of the ion beam apparatus shown in FIG. 1 will be described in more detail. The ion beam apparatus includes a vacuum chamber 20. An ion beam lens barrel 21 configured with the plasma ion source 1 that emits gas ions such as argon, neon, xenon, krypton, oxygen, or nitrogen ions, a first condenser lens 2, a second condenser lens 3, the stencil mask 4, a projection lens 5, and the like is connected to the vacuum chamber 20. In other words, the ion beam 6 is emitted and focused within the ion beam lens barrel 21 connected to the vacuum chamber 20.

It is noted that the ion beam apparatus according to the first embodiment includes the three lenses (the first condenser lens 2, the second condenser lens 3, and the projection lens 5) in the ion beam irradiation system. Furthermore, the sample 11, a secondary particle detector 12, the stage 13 that holds the sample 11, a probe 15, a gas source 17, a manipulator 43, and the like are disposed in a sample chamber 23 provided on the vacuum chamber 20.

Moreover, as a control section 24 that controls the present ion beam apparatus, a controller for plasma ion source 91, a controller for lens 92, a controller for stage 14, a controller for manipulator 16, a controller for gas source 18, a controller for secondary particle detector 19, a controller for stencil mask 93, a computer processor 95, and the like are disposed. Among these elements, the computer processor 95 includes a display that displays an image generated on the basis of a detection signal of the secondary particle detector 12, information input by information input means (not shown), and the like. Furthermore, the stage 13 that holds the sample 11 includes a linear motion mechanism moving in two directions orthogonal to each other in a sample mounting surface, a linear motion mechanism moving in a perpendicular direction to the sample mounting surface, a rotation mechanism rotating in the sample mounting surface, and a tilting mechanism having an axis of tilt in the sample mounting surface. These mechanisms are controlled by the controller for stage 14 in response to a command from the computer processor 95.

With these elements, the control section 24 exercises first control for irradiating the sample 11 with a first ion beam 6a shown in FIGS. 2 to 6, to be described later, among ion beams to etch the sample 11, and second control for forming a second ion beam 6b of which a magnitude of a skirt width S (refer to FIG. 6) of a longitudinal section is smaller than a magnitude of a skirt width S of a longitudinal section of the first ion beam 6a. Furthermore, the control section 24 exercises third control for irradiating a region wider than a region irradiated with the first ion beam 6a in a direction along a beam width R (refer to FIG. 6) with the second ion beam 6b, to etch the sample 11.

Moreover, an electron gun lens barrel 22 configured with an electron gun 7, a lens for electron beam 9 focusing an electron beam 8 emitted from the electron gun 7, an electron beam scanning deflector 10, and the like is disposed in the present ion beam apparatus.

Operation performed by the present ion beam apparatus will next be described. First, a gas valve provided halfway along a pipe from an argon cylinder is opened, thereby introducing argon gas into the plasma ion source 1 to generate plasma by gas discharge. The projection ion beam 6 is then extracted from the plasma ion source 1. This projection ion beam 6 is focused on neighborhoods of a center of the projection lens 5 by the first condenser lens 2 and the second condenser lens 3. In other words, the computer processor 95 sets voltages applied to electrodes of the first condenser lens 2 and the second condenser lens 3 to have values determined in advance by calculation to satisfy this focusing condition.

The projection ion beam 6 is then passed through the stencil mask 4 having a rectangular hole (opening portion). The projection lens 5 controls the opening portion of the stencil mask 4 in a condition of projecting the projection ion beam 6 onto the sample 11. Similarly to the above, the computer processor 95 sets a voltage applied to electrodes of the projection lens 5 to have a value determined in advance by calculation to satisfy this condition. The rectangular projection ion beam 6 is then radiated onto the sample 11. When this projection ion beam 6 is continuously radiated, a rectangular hole is formed in the sample 11.

A procedure of sample observation by the electron beam 8 will next be described. The electron beam 8 emitted from the electron gun 7 is focused to be radiated to the sample 11. At this time, the sample 11 can be observed by irradiating a cross-section of the sample 11 with the electron beam 8 while scanning the electron beam 8, detecting secondary electrons emitted from the cross-section of the sample 11 by the secondary particle detector 12, and converting an intensity of the secondary electrons into a luminance of an image. A surface of the sample 11 processed by the projection ion beam 6 can be thereby observed.

Figure 2:
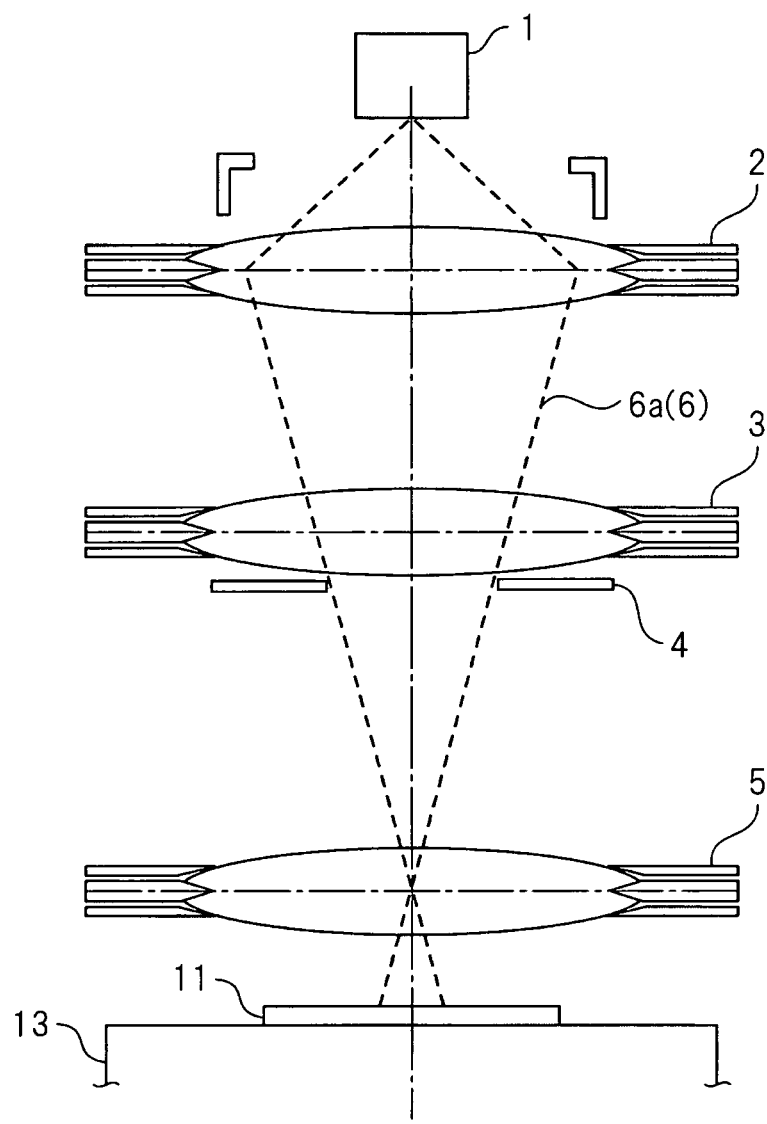
FIG. 2 is a schematic configuration diagram showing an example of a lens configuration of the ion beam apparatus of FIG. 1.
Figure 3:
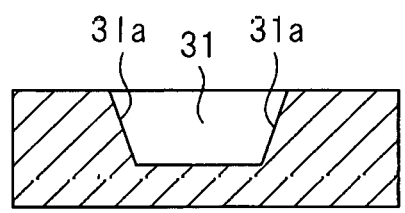
FIG. 3 is a cross-sectional view showing a structure of a sample processed by the ion beam apparatus of FIG. 2.
Figure 4:
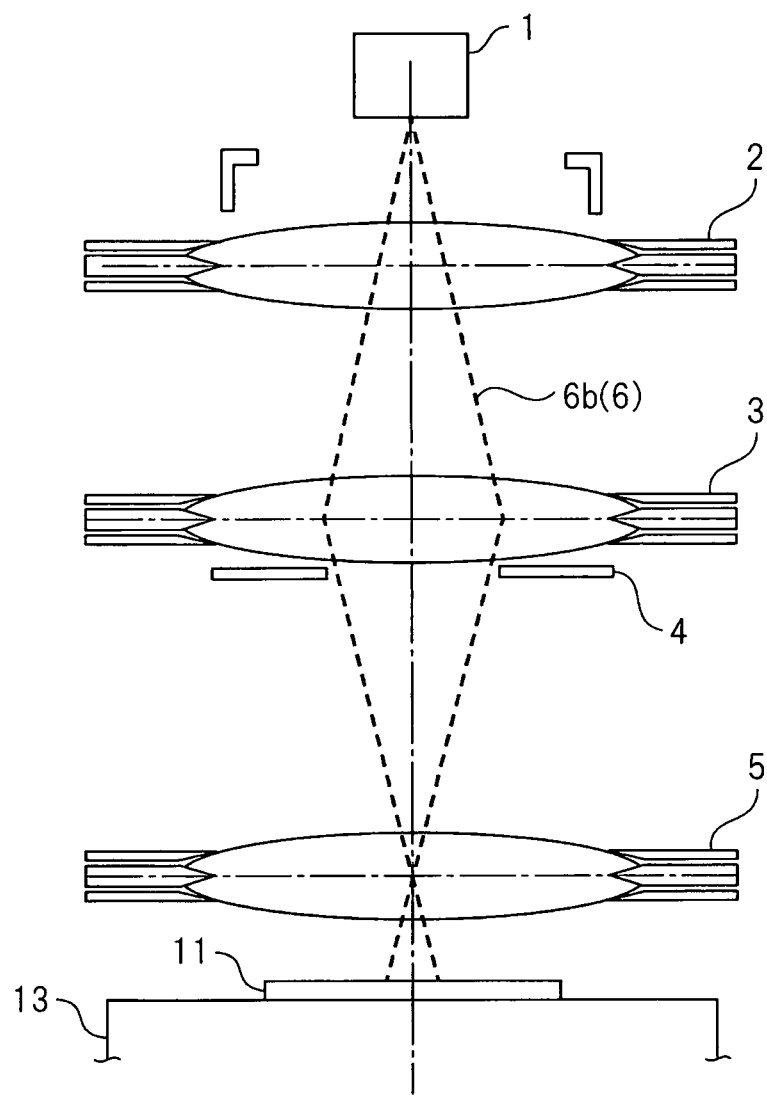
FIG. 4 is a schematic configuration diagram showing an example of a lens configuration of the ion beam apparatus of FIG. 1.
Figure 5:
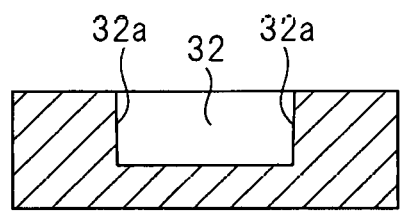
FIG. 5 is a cross-sectional view showing a structure of a sample processed by the ion beam apparatus of FIG. 4.
Figure 6:
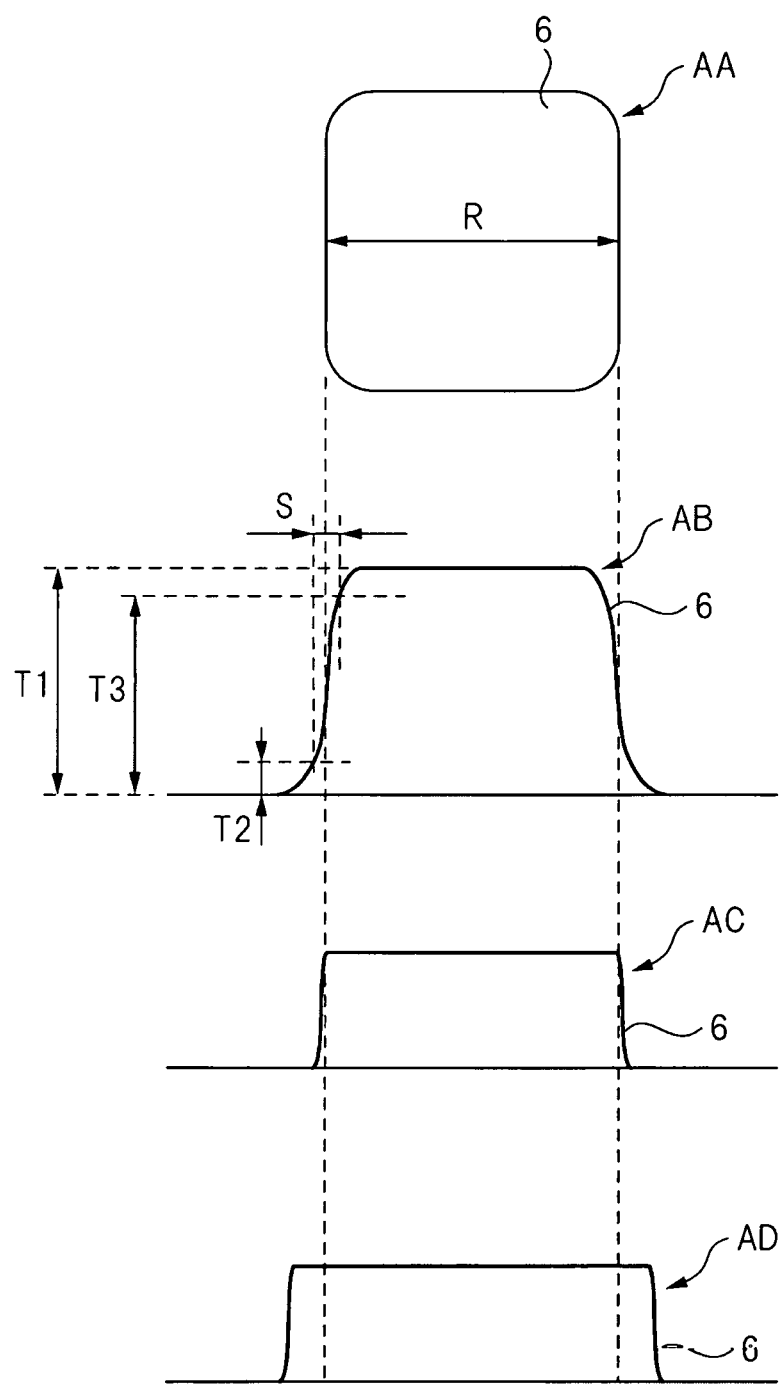
FIG. 6 is a schematic configuration diagram showing an example of a skirt width of an ion beam in the ion beam apparatus of FIG. 1.

Next, hole etching processing by the present ion beam apparatus in the manufacturing of the microstructure, for example, MEMS of a sensor, an actuator, an electronic circuit, and the like will be described. FIG. 2 is a schematic configuration diagram showing an example of a lens configuration of the ion beam apparatus of FIG. 1. FIG. 3 is a cross-sectional view showing a structure of the sample processed by the ion beam apparatus of FIG. 2. In addition, FIG. 4 is a schematic configuration diagram showing an example of a lens configuration of the ion beam apparatus of FIG. 1. FIG. 5 is a cross-sectional view showing a structure of the sample processed by the ion beam apparatus of FIG. 4. FIG. 6 is a schematic configuration diagram showing an example of a skirt width of the ion beam in the ion beam apparatus of FIG. 1.

The present ion beam apparatus can control a magnitude of a skirt width S of a beam profile of the projection ion beam 6 shown in FIG. 6 (also referred to as "skirt width S of a longitudinal section or profile of the projection ion beam 6," "edge blur of the beam," or the like).

Control over the magnitude of the skirt width S of the beam profile of the projection ion beam 6 will be described with reference to FIGS. 2 to 5. As described above, the present ion beam apparatus causes the control section 24 to exercise control for focusing the projection ion beam 6 extracted from the plasma ion source 1 on the center of the projection lens 5 by the first condenser lens 2 and the second condenser lens 3. Satisfying this condition makes it possible to reduce a distortion in a shape of the projection ion beam 6. In other words, when the opening portion of the stencil mask 4 is rectangular, the rectangular projection ion beam 6 with a slight distortion can be radiated onto the sample 11. When a virtual light source of the plasma ion source 1 is focused on a principal surface of the projection lens 5 by the first condenser lens 2 and the second condenser lens 3, the magnitude of the skirt width S of the beam profile of the projection ion beam 6 can be reduced as an image of the virtual light source on the principal surface is smaller in magnitude.

In the ion beam apparatus shown in FIG. 1 according to the first embodiment, when the ion beam is focused on the principal surface of the projection lens 5 by the first condenser lens 2, as shown in FIG. 2, the image on the principal surface becomes large and the magnitude of the skirt width S of the beam profile of the projection ion beam 6 is increased. Despite an increase in the magnitude of the skirt width S, it can be said that this is a beam mode appropriate for high speed processing since an ion beam current increases. This beam mode is assumed as, for example, beam mode A. FIG. 3 schematically shows a cross-sectional shape of a hole 31 when the sample 11 is subjected to the hole etching processing by the projection ion beam 6 at this time. In addition, as shown in FIG. 3, an inner wall 31a of the hole 31 is tilted at a slight angle with respect to a bottom portion.

On the other hand, as shown in FIG. 4, when the projection ion beam 6 is focused on the principal surface of the projection lens 5 by the second condenser lens 3, the image on the principal surface becomes small and the magnitude of the skirt width S of the beam profile of the projection ion beam 6 is reduced. In this case, it can be said that this is a beam mode appropriate for high accuracy processing although the ion beam current is lower than that in the beam mode A. This beam mode is assumed as, for example, beam mode B. FIG. 5 schematically shows a cross-sectional shape of a hole 32 when the sample 11 is subjected to the hole etching processing by the projection ion beam 6 at this time. As shown in FIG. 5, an inner wall 32a of the hole 32 has a steep angle with respect to a bottom portion. It is noted that FIGS. 2 to 5 schematically express processed cross-sections of the sample 11 to help understanding. In addition, tilting of the inner wall 31a or 32a is expressed as a line but actually a curve.

Further, FIG. 6 shows, for the projection ion beam 6 of which a planar structure has a beam shape AA of FIG. 6, an example of beam profiles in the beam mode A (in a beam shape AB of FIG. 6) and the beam mode B (in a beam shape AC of FIG. 6). Here, to quantitatively handle steepness of the magnitude of the skirt width S of each beam profile (magnitude of the skirt width S of the longitudinal section of the ion beam), the skirt width S of the beam profile will be defined. For example, as indicated by the beam shape AB of FIG. 6, the skirt width S of the beam profile is defined as a distance between a point where the beam intensity is 16% of T1 (T2) and a point where the beam intensity is 84% of T1 (T3). It is noted that a beam shape AD of FIG. 6 indicates a beam profile when a magnitude of a set irradiation region irradiated with the projection ion beam 6 in the beam mode B, that is, the ion beam is increased.

In addition, a vertical axis of each beam shape of FIG. 6 expresses a magnitude of a beam current. Actually, it is possible to form an image at an arbitrary beam diameter on the principal surface of the projection lens 5 by allowing the two lenses of the first condenser lens 2 and the second condenser lens 3 to operate to be linked with each other. In other words, the magnitude of the skirt width S of the beam profile of the projection ion beam 6 and the ion beam current can be changed continuously. Therefore, the ion beam apparatus according to the first embodiment can perform processing in the hole etching processing on the microstructure while exercising control over a processing speed and steepness of the inner wall of the hole.

It is noted that a shape of the inner wall is often processed to be as steep as possible in the hole processing on the microstructure. Processing the shape of the inner wall to be steep facilitates controlling structural dimensions of the microstructure and makes it possible to obtain desired device characteristics. In that case, the projection ion beam 6 in the beam mode B is formed to process the hole. However, as described above, it takes time for processing in this beam mode B.

To address the problem, the inventor of the present invention conducted a study of radiating the ion beam in the beam mode A first to perform hole processing halfway, forming not the ion beam but a very fine ion beam for finishing for focusing the virtual light source of the ion source on the sample by three stages of lenses, radiating the ion beam for finishing only on the inner wall, and improving the steepness of the inner wall. The inventor of the present invention found that although this method can indeed improve the steepness of the inner wall, it was actually difficult to apply the method to the manufacturing of the microstructure. This is because it is difficult to optimize an ion beam forming condition and an ion beam irradiation condition, it is also difficult to radiate the ion beam only on the inner wall, and it takes time. The inventor also found that a problem occurred that flatness of a bottom portion of the hole was degraded since the very fine ion beam was also radiated to the bottom portion of the hole to dent the bottom portion of the hole and particles sputtered from the inner wall were gathered in the bottom portion of the hole to generate a swell.

Next, the inventor of the present invention searched for a hole processing method suitable for the manufacturing of the microstructure. First, the inventor contrived of and executed a processing method including radiating the ion beam in the beam mode A first to perform the hole processing halfway, and then radiating not the focused ion beam but the ion beam in the beam mode B using the same opening portion of the stencil mask 4 as that used for the ion beam in the beam mode A. A challenge of this manufacturing method was to accurately match an irradiation position of the projection ion beam in the beam mode A to that of the projection ion beam in the beam mode B. To address the challenge, a misalignment amount between the irradiation positions of the ion beam in the beam mode A and that in the beam mode B when the ion beam in the beam mode B was radiated using the same opening portion without moving the stencil mask 4 was measured; it was thus possible to match the irradiation position of the ion beam in the beam mode B to that of the ion beam in the beam mode A.

As a result of realizing and evaluating this processing method, the inventor of the present invention succeeded in shortening processing time, compared with that in a conventional processing method and improving the steepness of the inner wall. Nevertheless, a detailed study revealed that this method caused the following problems. A first problem is occurrence of a dimensional error. In the manufacturing of the microstructure, processing was performed using a mask having an opening portion at a magnitude obtained by dividing a design dimension of the microstructure by a projection magnification. In actuality, however, because a processing region widens by as much as the magnitude of the skirt width S of the beam profile of the ion beam in the beam mode A radiated first, device characteristics as designed were not always obtained. Furthermore, as a result of a detailed study of the steepness of the inner wall of the processed hole, the inventor found that a shear drop was generated in a shape of the inner wall, compared with high accuracy processing using only the ion beam in the beam mode B. In other words, sufficient steepness was not obtained.

Figure 7:
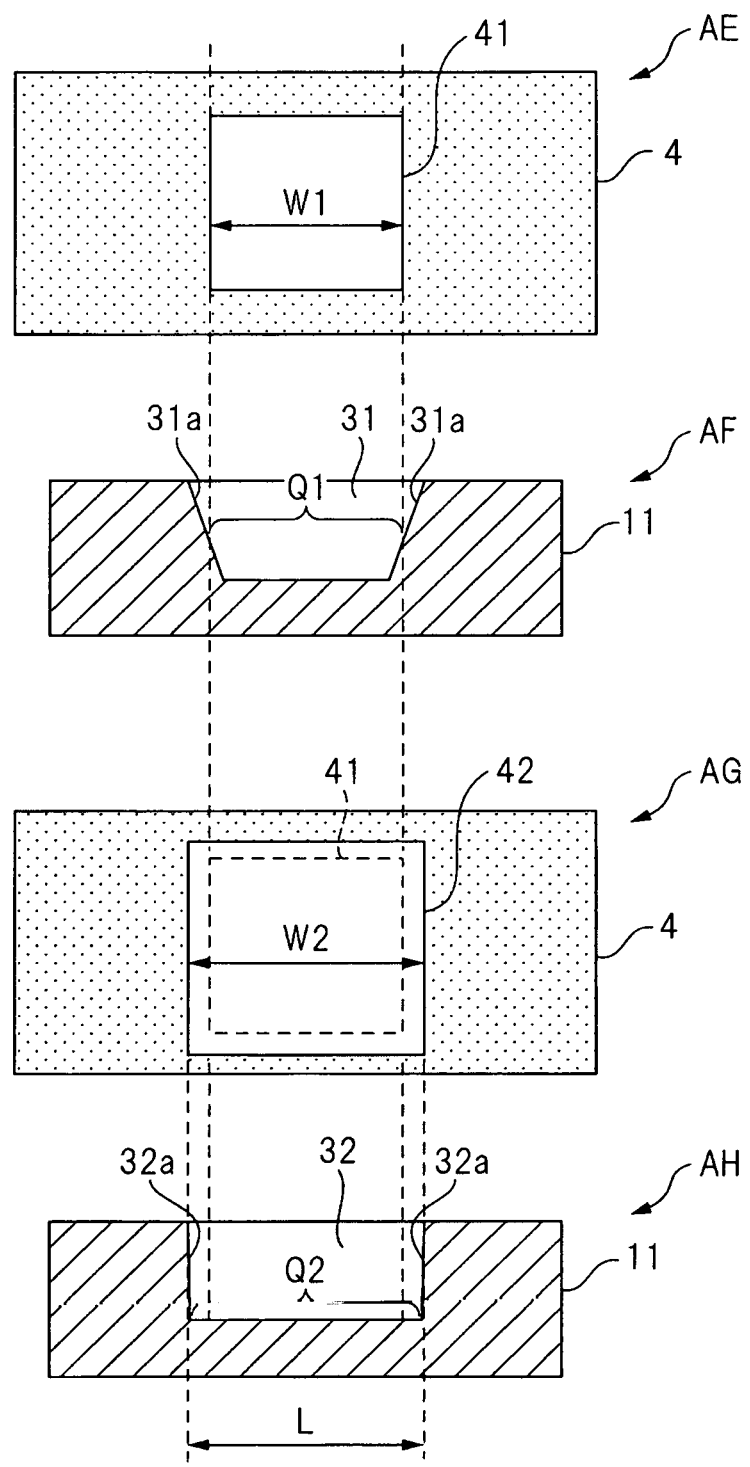
FIG. 7 is a plan view and a cross-sectional view showing an example of structures of a mask and the sample used in the ion beam apparatus of FIG. 1.

The inventor of the present invention then continued to search for a processing method with higher accuracy and a higher speed. As a result, the inventor found that the following manufacturing method was appropriate. The manufacturing method will be described with reference to FIG. 7. FIG. 7 is a plan view and a cross-sectional view showing an example of structures of a mask and the sample used in the ion beam apparatus of FIG. 1.

First, the first ion beam 6a in the beam mode A shown in FIG. 2 is formed using a stencil mask (first mask) 4a having an opening portion (first opening portion, in a mask shape AE of FIG. 7) 41 at a width W1 smaller than a width W2 of an opening portion (second opening portion, in a mask shape AG of FIG. 7) 42 having a magnitude obtained by dividing a design dimension L of a microstructure in a cross-sectional shape AH shown in FIG. 7 by a desired projection magnification. This first ion beam 6a is radiated on a first region Q1 (in a cross-sectional shape AF of FIG. 7) of the sample 11 to realize high speed processing. A shape of the opening portion 41 of the stencil mask 4a at this time is shown in the mask shape AE of FIG. 7. Furthermore, it is clear from the cross-sectional shape AF of FIG. 7, in which a cross-sectional shape of the hole 31 processed in the sample 11 is schematically shown, that an inner wall 31a of the hole 31 is tilted and an upper portion and a lower portion of the opening portion (hole 31) differ in dimension.

Next, the second ion beam 6b in the beam mode B shown in FIG. 4 is formed using the opening portion (second opening portion) 42 having a similar shape to that of the opening portion (first opening portion) 41 and having a larger area than that of the opening portion 41, and radiated on a second region Q2 of the sample 11 (in a cross-sectional shape AH of FIG. 7). A shape of the opening portion 42 of the stencil mask (second mask) 4b at this time is shown in the mask shape AG of FIG. 7. Further, the second region Q2 is larger than the first region Q1.

It is noted that the magnitude of the skirt width S of the beam profile of the projection ion beam 6 (second ion beam 6b) at this time is that shown in the beam shape AD of FIG. 6. This means that the set region that includes almost entirely the region subjected to the hole etching processing by the first ion beam 6a and that is wider than the region irradiated with the first ion beam 6a in the direction along the beam width R in the beam shape AA of FIG. 6 is irradiated with the second ion beam 6b.

It is noted that the control section 24 of the ion beam apparatus shown in FIG. 1 exercises control for forming the first ion beam 6a by being passed through the opening portion (first opening portion) 41 among the opening portions of a plurality of types of shapes (magnitudes), and forming the second ion beam 6b by being passed through the opening portion (second opening portion) 42 larger in area than the opening portion 41.

Likewise, the control section 24 of the ion beam apparatus shown in FIG. 1 exercises control for setting a beam current of the second ion beam 6b formed by being passed through the opening portion (second opening portion) 42 larger in area than the opening portion (first opening portion) 41 to be lower than a beam current of the first ion beam 6a formed by being passed through the opening portion 41 among the opening portions of the plurality of shapes (magnitudes).

As a result of performing the hole etching processing as described above and studying the inner wall of the opening portion in detail, it is found that the inner wall of the hole can be processed to be sufficiently steep. In the cross-sectional shape AR of FIG. 7, a cross-sectional shape of the hole 32 formed in this sample 11 is schematically shown. By doing so, it is possible to produce an effect that it is possible to provide a microstructure manufacturing method capable of obtaining a sufficient processing speed and obtaining sufficient processing accuracy when the microstructure is manufactured, for example, when the MEMS of the sensor, the actuator, the electronic circuit, and the like are manufactured using ion beams. It is noted that the opening portion (first opening portion) 41 may be formed into the opening portion (second opening portion) 42 in the first embodiment by moving the stencil mask 4 to a position equivalent in plane. FIG. 7, therefore, schematically expresses the processed cross-section to help understanding. In addition, the tilting of the inner wall is expressed as a line but actually a curve.

Furthermore, when the processing method described above is executed, it is possible to perform the hole etching processing such that the hole processed by the projection ion beam 6 has a steeply tilted inner wall in an entire outer circumferential portion of the hole. In other words, it is possible to reduce the dimensional difference between the upper portion and the lower portion of the opening portion of the hole. In addition, it is possible to produce an effect that it is possible to provide the microstructure manufacturing method capable of suppressing non-steepness of corners (corner portions) of the opening portion and ensuring high accuracy.

Moreover, with the processing method, the beam current of the second ion beam 6b is lower than that of the first ion beam 6a. This causes a reduction in the processing speed as a current of the second ion beam 6b becomes lower; it is nevertheless possible to provide the microstructure manufacturing method capable of highly accurate control over an etching depth.

It is noted herein that a reason for enabling realization of processing of the inner wall of the hole to be steep as described above is as follows. An inner wall portion of the hole formed by the first ion beam 6a is irradiated with a steep edge portion of the second ion beam 6b. It is also considered that the processing of the inner wall of the hole to be steep is realized in relation to a property that a larger amount of substance particles are sputtered at a slighter angle of incidence of the ion beam when the ion beam sputters the substance particles. It is further considered that if irradiated regions at the same width are set as those irradiated with the first ion beam 6a and the second ion beam 6b, then an end region irradiated with the first ion beam 6a, that is, an uppermost region of the opening portion of the hole is unlikely to be irradiated with the second ion beam 6b; thus, a gentle tilt region remains and sufficient steepness cannot be obtained.

It is also clear that according to the first embodiment, when the second ion beam 6b is radiated to process the hole, the control section 24 of the ion beam apparatus shown in FIG. 1 exercises control for radiating the second ion beam 6b until the bottom portion of the etched hole becomes generally flat, whereby it is possible to make the bottom portion of the etched hole flat. The reason for enabling the bottom portion of the hole to be made flat is that when the inner wall of the hole is irradiated with the projection ion beam 6, the bottom portion of the hole is continuously irradiated with the projection ion beam 6 at a uniform current density at the same time. This respect is also an excellent effect of the processing method according to the first embodiment, compared with the conventional method of finishing the bottom portion of the hole by a fine focused ion beam. In other words, the first embodiment exhibits an effect that it is possible to provide the microstructure manufacturing method suited particularly for finishing the bottom portion of the etched hole to be flat. It is noted that flatness as in "the bottom portion of the hole is finished to be flat" means flatness for which irregularities caused by processing variation are permissible.

Moreover, according to the first embodiment, it is possible to provide the ion beam apparatus capable of realizing high accuracy processing by forming the two types of projection ion beams 6 by plane motion of the stencil mask 4.

Furthermore, it is possible to provide the microstructure manufacturing method capable of realizing high accuracy processing by matching the processing dimension of the sample 11 that is the microstructure to the design dimension of the sample 11 in anticipation that a dimension of a region of a processing trace of the sample 11 is larger than a dimension when the projection ion beam 6 after being passed through the opening portion (first opening portion) 41 of the stencil mask 4a that serves as the first mask is projected onto the sample 11 at a desired projection magnification. In other words, the first embodiment exhibits an effect that it is possible to provide the microstructure manufacturing method capable of realizing high accuracy processing particularly for the design dimension of the microstructure.

While a case of using the axisymmetric lenses as the condenser lenses has been described in the first embodiment, ion beam lenses configured from double quadrupole lenses and asymmetrical about an ion beam axis can be used as an alternative to the axisymmetric lenses.

Furthermore, while argon is used in the example of the first embodiment described above, it is obvious that similar effects can be obtained even using the other element such as nitrogen, oxygen, neon, xenon, and krypton or ion species of a mixture thereof.

(Second Embodiment)

Figure 8:
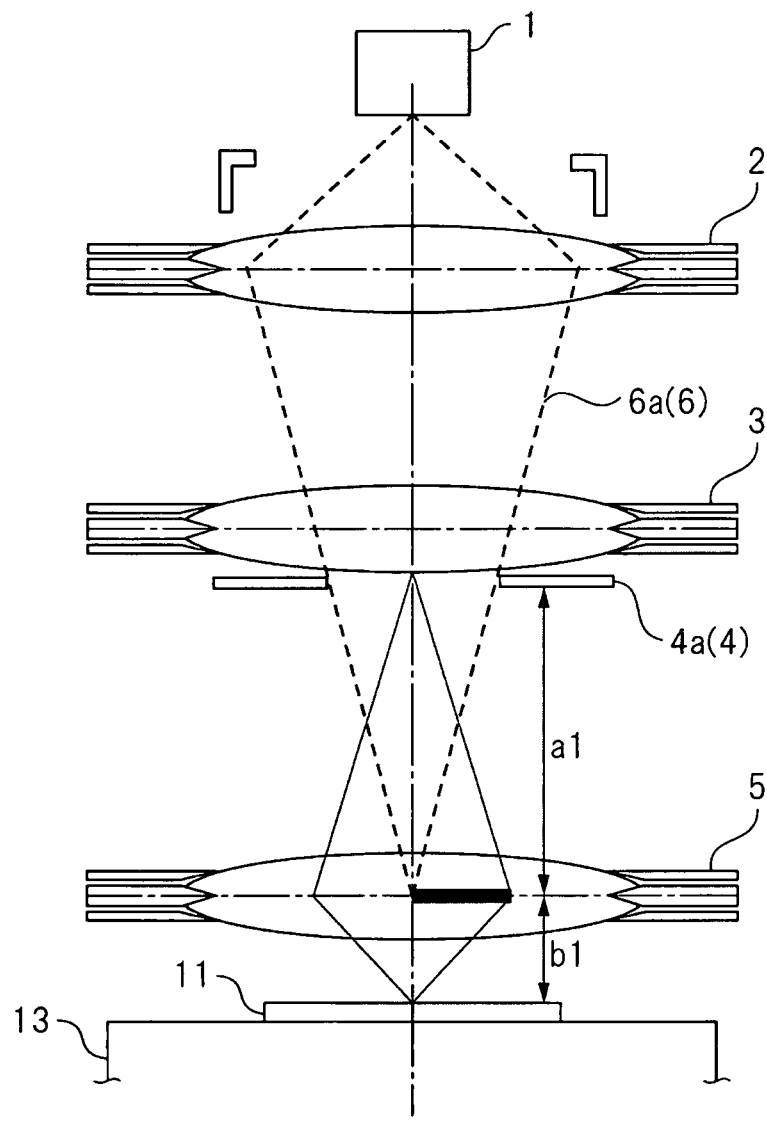
FIG. 8 is a schematic configuration diagram showing an example of a lens configuration of the ion beam apparatus of FIG. 1.
Figure 9:
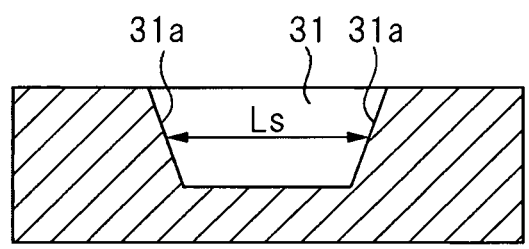
FIG. 9 is a cross-sectional view showing a structure of a sample processed by the ion beam apparatus of FIG. 8.
Figure 10:
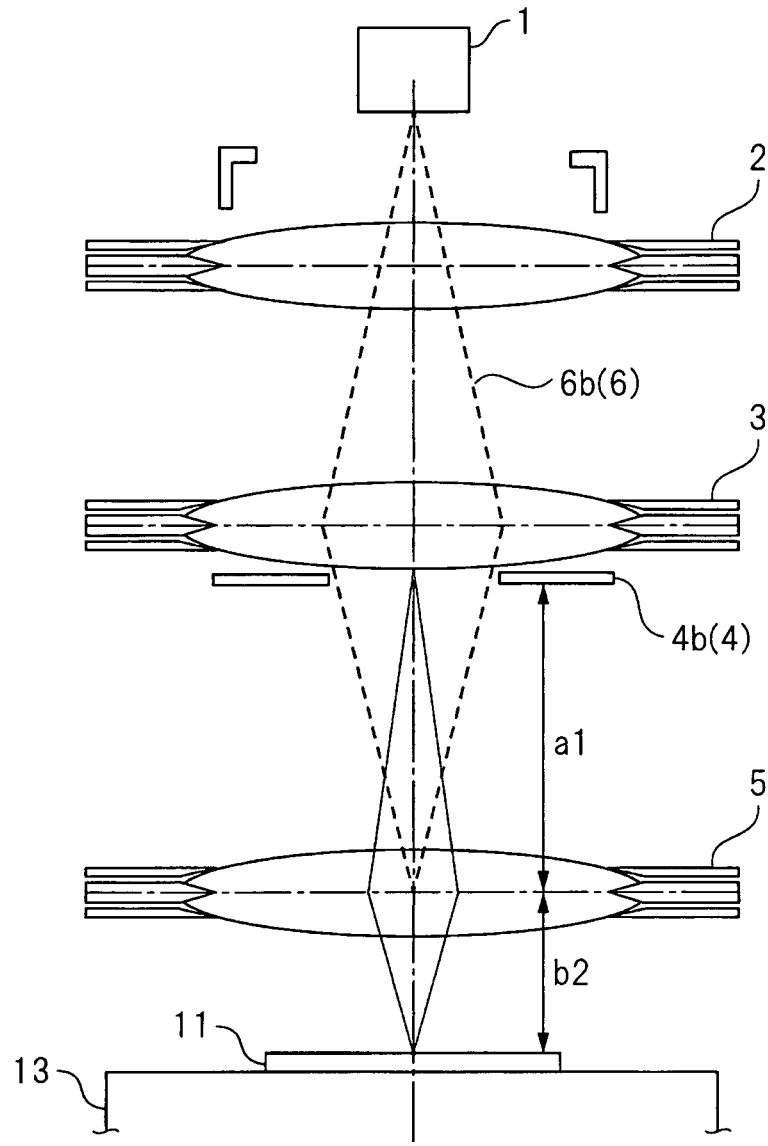
FIG. 10 is a schematic configuration diagram showing an example of a lens configuration of the ion beam apparatus of FIG. 1.
Figure 11:
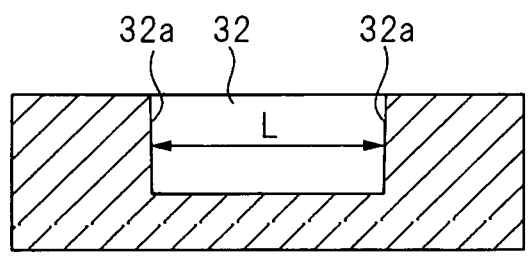
FIG. 11 is a cross-sectional view showing a structure of a sample processed by the ion beam apparatus of FIG. 10.

An example of a microstructure manufacturing method and an ion beam apparatus according to a second embodiment will be described. FIG. 8 is a schematic configuration diagram showing an example of a lens configuration of the ion beam apparatus of FIG. 1. FIG. 9 is a cross-sectional view showing a structure of a sample processed by the ion beam apparatus of FIG. 8. FIG. 10 is a schematic configuration diagram showing an example of a lens configuration of the ion beam apparatus of FIG. 1. FIG. 11 is a cross-sectional view showing a structure of a sample processed by the ion beam apparatus of FIG. 10.

A basic structure of the ion beam apparatus according to the second embodiment is the same as that of the ion beam apparatus according to the first embodiment shown in FIG. 1, and description thereof is, therefore, omitted. In addition, in the ion beam apparatus according to the second embodiment similarly to the first embodiment, the stencil mask 4 having the opening portion of the predetermined shape is inserted into halfway along the ion beam irradiation system, and the sample is irradiated with the ion beam formed by being passed through the opening portion. Further, the ion source 1 is the plasma ion source that extracts an ion beam of the gaseous element such as inert gas, oxygen, or nitrogen, similarly to the first embodiment.

Furthermore, the stage 13 of the ion beam apparatus according to the second embodiment includes the linear motion mechanism moving in the two directions orthogonal to each other in the sample mounting surface, and the linear motion mechanism moving in the perpendicular direction to the sample mounting surface, similarly to the ion beam apparatus according to the first embodiment.

The second embodiment will be described with reference to FIGS. 8 to 11. It is noted that FIGS. 9 and 11 schematically show cross-sectional shapes of the hole when the sample is subjected to the hole etching processing by projection ion beams. It is noted that FIGS. 9 and 11 schematically express processed cross-sections to help understanding, and that the tilting of the inner wall of the hole is expressed as a line but actually a curve.

Furthermore, the ion beam apparatus according to the second embodiment includes a mechanism for causing the linear motion mechanism moving in the perpendicular direction to the sample mounting surface of the stage 13 to exercise control over a projection magnification of the projection ion beam 6. In other words, the ion beam apparatus can raise the projection magnification by moving a height of the stage 13 that holds the sample 11 in a direction of being apart from the plasma ion source 1, and can conversely reduce the projection magnification by moving the height thereof closer to the plasma ion source 1. However, the projection ion beam 6 deforms in a state of moving the stage 13 without taking any measures. In other words, it is necessary to change a voltage applied to the projection lens 5 in accordance with vertical movement of the stage 13, and maintain a condition for projecting a shape of the opening portion of the stencil mask 4 onto the sample 11. The ion beam apparatus according to the second embodiment executes the vertical movement of the stage 13 and the change of the voltage applied to the projection lens 5 in an integrated fashion. It is noted that in the ion beam apparatus shown in FIG. 1, the control section 24 exercises control for vertically moving the height of the stage 13.

In FIG. 8, similarly to a structure of FIG. 2, the projection ion beam 6 is focused on the principal surface of the projection lens 5 by the first condenser lens 2, and the magnitude of the skirt width S (magnitude of the edge blur) of the beam profile, shown in FIG. 6, of the projection ion beam 6 (first ion beam 6a) is large. A projection magnification of projecting the opening portion of the stencil mask 4 onto the sample 11 at this time is b1/a1. On the other hand, in FIG. 10, similarly to FIG. 4, the projection ion beam 6 is focused on the principal surface of the projection lens 5 by the second condenser lens 3, and the magnitude of the skirt width S (magnitude of the edge blur) of the beam profile of the projection ion beam 6 (second ion beam 6b) is small. Furthermore, the height of the stage 13 is moved in the direction of being apart from the plasma ion source 1. A projection magnification of projecting the opening portion of the stencil mask 4 onto the sample 11 in this case is b2/a1. In other words, since b2 is greater than b1, the projection magnification b2/a1 of FIG. 10 is higher than the projection magnification b1/a1 of FIG. 8. In other words, even if the same opening portion is used, the width L of the hole 32 (second region) formed in the sample 11 by the second ion beam 6b shown in FIG. 11 is larger than a width Ls of the hole 31 (first region) formed by the first ion beam 6a of FIG. 8 (L>Ls).

In the first embodiment, the second ion beam 6b is formed using the opening portion (second opening portion) 42 having the similar shape to that of the opening portion (first opening portion) 41 of the stencil mask 4 and having the larger area than that of the opening portion 41 as shown in FIG. 7. On the other hand, in the second embodiment, the projection magnification is raised by moving the height of the stage 13 that holds the sample 11 in the direction of being apart from the plasma ion source 1 as shown in FIG. 10. At the same time, the projection lens 5 is controlled such that the opening portion of the stencil mask 4 is projected onto the sample 11. It is thereby possible to set the set region (second region L shown in FIG. 11) wider than the region (first region Ls shown in FIG. 9) irradiated with the first ion beam 6a, and irradiate the set region (second region L shown in FIG. 11) with the second ion beam 6b with particularly high accuracy.

Moreover, in the second embodiment, the set region (second region L shown in FIG. 11) can be irradiated with the second ion beam 6b by moving the stencil mask 4 (stencil mask 4b serving as a second mask) in the direction of being apart from the plasma ion source 1 and raising the projection magnification. In other words, reducing a1 shown in FIG. 8 makes it possible to raise the projection magnification b1/a1. At the same time, the projection lens 5 is controlled such that the opening portion of the stencil mask 4 is projected onto the sample 11. It is thereby possible to irradiate the set region (second region L shown in FIG. 11) wider than the region (first region Ls shown in FIG. 9) irradiated with the first ion beam 6a, with the second ion beam 6b with particularly high accuracy.

As described so far, the ion beam apparatus according to the second embodiment can perform the hole etching processing such that the hole processed by the projection ion beam 6 is steeply tilted in the entire outer circumferential portion of the hole similarly to the ion beam apparatus according to the first embodiment by controlling the height of the stage 13 or the height of the stencil mask 4. In other words, it is possible to reduce the dimensional difference between the upper portion and the lower portion of the opening portion of the hole. In addition, it is possible to produce an effect that it is possible to provide the microstructure manufacturing method capable of suppressing non-steepness of corners (corner portions) of the opening portion and ensuring high accuracy. Furthermore, it is possible to exhibit an effect that it is possible to provide the microstructure manufacturing method capable of obtaining a sufficient processing speed and obtaining sufficient processing accuracy when the microstructure is manufactured, for example, when the MEMS of the sensor, the actuator, the electronic circuit, and the like are manufactured using ion beams.

According to the second embodiment, the projection magnification can be continuously adjusted particularly because the height of the stage 13 can be continuously selected. It is thereby possible to exhibit an effect that a processing condition for a peripheral portion of the opening portion of the hole can be optimized with high accuracy. At the same time, it is possible to exhibit an effect that it is possible to provide the ion beam apparatus capable of optimizing the processing condition for the peripheral portion of the opening portion of the hole with high accuracy.

(Third Embodiment)

Figure 12:
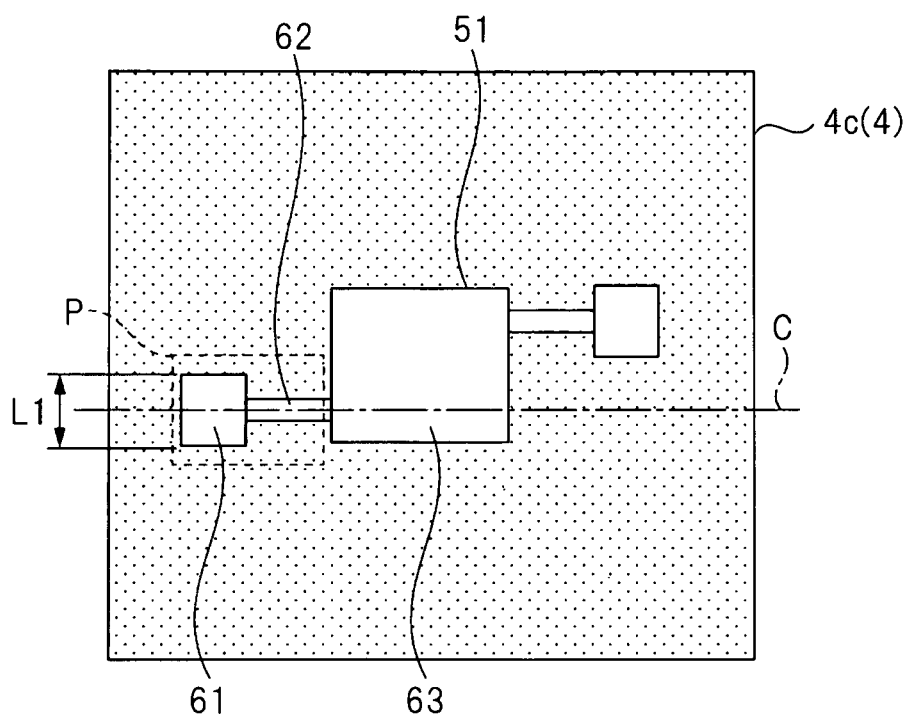
FIG. 12 is a plan view showing an example of a structure of a mask used in the ion beam apparatus according to the present invention.
Figure 13:
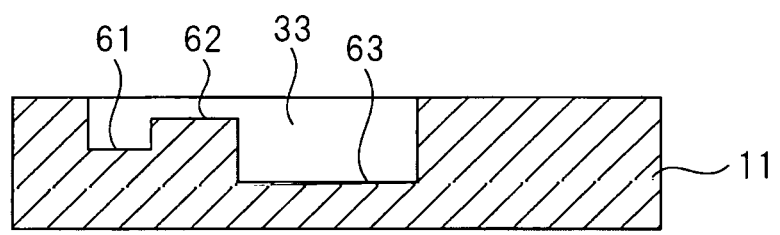
FIG. 13 is a cross-sectional view showing a structure of a sample processed using the mask of FIG. 12.
Figure 14:
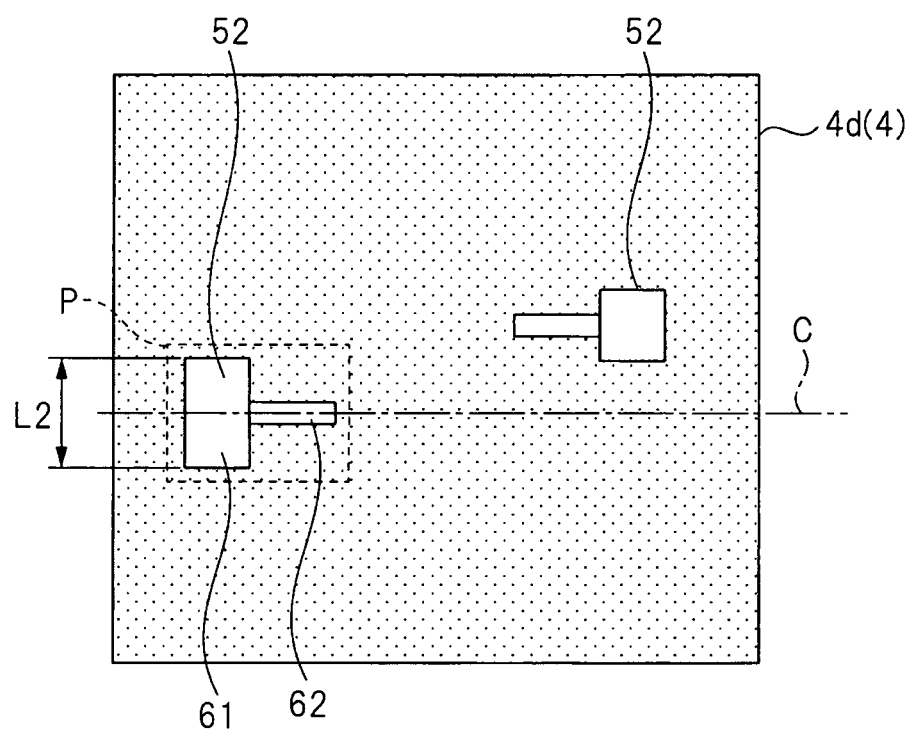
FIG. 14 is a plan view showing an example of a structure of a mask used in the ion beam apparatus according to the present invention.
Figure 15:
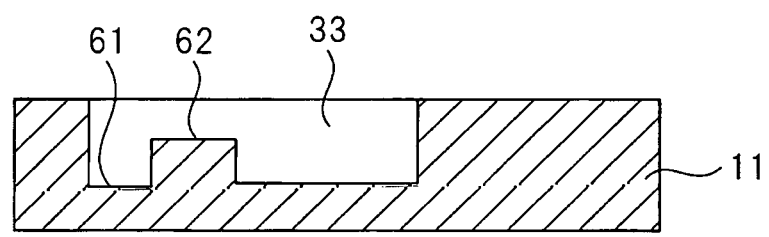
FIG. 15 is a cross-sectional view showing a structure of a sample processed using the mask of FIG. 14.
Figure 16:
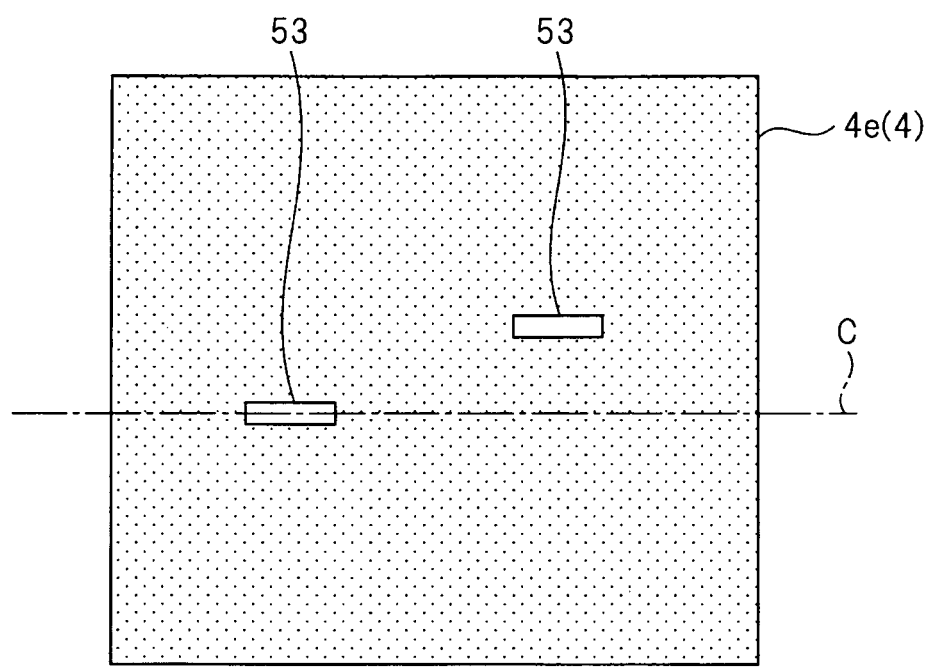
FIG. 16 is a plan view showing an example of a structure of a mask used in the ion beam apparatus according to the present invention.
Figure 17:
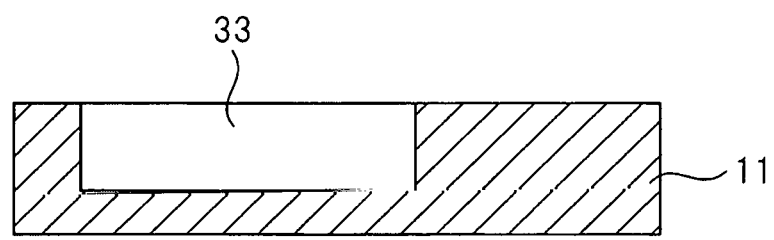
FIG. 17 is a cross-sectional view showing a structure of a sample processed using the mask of FIG. 16.

An example of a microstructure manufacturing method and an ion beam apparatus according to a third embodiment will be described. FIG. 12 is a plan view showing an example of a structure of a mask used in the ion beam apparatus according to the present invention. FIG. 13 is a cross-sectional view showing a structure of a sample processed using the mask of FIG. 12. FIG. 14 is a plan view showing an example of a structure of a mask used in the ion beam apparatus according to the present invention. In addition, FIG. 15 is a cross-sectional view showing a structure of a sample processed using the mask of FIG. 14. FIG. 16 is a plan view showing an example of a structure of a mask used in the ion beam apparatus according to the present invention. FIG. 17 is a cross-sectional view showing a structure of a sample processed using the mask of FIG. 16.

A basic structure of the ion beam apparatus according to the third embodiment is the same as that of the ion beam apparatus according to the first embodiment shown in FIG. 1, and description thereof is, therefore, omitted. In addition, in the ion beam apparatus according to the third embodiment similarly to the first embodiment, the stencil mask 4 having the opening portion of the predetermined shape is inserted into halfway along the ion beam irradiation system, and the sample is irradiated with the ion beam formed by being passed through the opening portion. Further, the ion source is the plasma ion source that extracts an ion beam of the gaseous element such as inert gas, oxygen, or nitrogen, similarly to the first embodiment.

The third embodiment is characterized by a shape of the opening portion of the stencil mask 4. FIGS. 12, 14, and 16 shows the stencil masks used in the third embodiment.

First, a first projection ion beam was passed through an opening portion 51 of a stencil mask (third mask) 4c shown in FIG. 12, and the sample 11 shown in FIG. 13 was irradiated with this projection ion beam to perform the hole etching processing. Here, a shape of the opening portion 51 of the stencil mask 4c shown in FIG. 12 and a shape of an opening portion 52 of a stencil mask 4d shown in FIG. 14 each include a recessed polygon (part P in FIGS. 12 and 14). It is noted that the recessed polygon means a polygon having at least one vertex angle of which a magnitude of an interior angle exceeds 180°.

Furthermore, in the stencil masks 4 shown in each of FIGS. 12, 14, and 16, a center line of an opening portion of the recessed polygon or an opening portion of a polygon is denoted by C, and a position of the center line C is identical in the stencil masks 4.

When a device was completed through various processes using the stencil mask 4c shown in FIG. 12 and actuated, desired characteristics could not be obtained. Owing to this, a dimension of the prototyped device was studied in detail. As a result, it was found that the prototyped device had several problems.

The first projection ion beam was formed using the opening portion 51 of the stencil mask 4c, and depths at several positions on a processing pattern were checked on the sample 11 subjected to the hole etching processing by being irradiated with the first projection ion beam. As a result, it was found that the depth slightly differed depending on the position. The reason is considered as follows. While a magnitude of the processing pattern differ depending on the processing position, a magnitude of an opening portion from which sputtered particles spring out into a vacuum differ from a viewpoint of the bottom portion of a hole 33. In addition, ratios of incoming sputtered particles from the other processing positions differ depending on the position.

FIG. 13 shows a cross-section of the hole 33. As is clear from FIG. 13, a processing depth is largest at a processing position 63 and the processing depth is smallest at a processing position 62 in regions of processing positions 61, 62, and 63. If it is defined here that the processing depth at the processing position 61 is a first depth and the processing depth at the processing position 62 is a second depth, the first and second depths have a relationship of first depth>second depth.

Next, a second projection ion beam was formed using the opening portion 52 of a stencil mask (fourth mask) 4d which is shown in FIG. 14 and which is part of the pattern of the opening portion 51, and the sample 11 shown in FIG. 15 was irradiated with the second projection ion beam to perform the hole etching processing. In other words, a portion at the first depth (portion at the processing position 61) and a portion at the second depth (portion at the processing position 62) were irradiated with the second ion beam to perform etching processing. Finally, a third projection ion beam was formed using an opening portion 53 of a stencil mask 4e shown in FIG. 16, and the sample 11 shown in FIG. 17 was irradiated with the third projection ion beam to perform the hole etching processing. Here, irradiation time of each projection ion beam was set in such a manner as to cancel a difference in depth among the positions. By so setting, it was possible to realize the hole etching processing such that the processing depth is the same even if the positions were different on the processing pattern as shown in FIG. 17. In other words, the third projection ion beam is radiated to perform the etching processing until a level difference of the bottom portion is eliminated (the bottom portion becomes flat) in the etching processing for forming the hole 33. Needless to say, flatness of the bottom portion does not include irregularities caused by processing variation.

The next problem results from the fact that the tilting of the inner wall of the region (hole 33) processed using the opening portion 51 of the stencil mask 4c shown in FIG. 12 similarly to the first embodiment was not steep. Therefore, similarly to the first embodiment, a lens condition was set such that a projection ion beam of which the magnitude of the skirt width S of the beam profile is smaller than that of the skirt width S of the beam profile of the first projection ion beam can be formed. In addition, a fourth projection ion beam was formed using an opening portion having a similar shape to that of the opening portion 53 of the stencil mask 4e shown in FIG. 16 and having a larger area than that of the opening portion 53, and the sample 11 was irradiated with the fourth projection ion beam. As a result, it was possible to process the inner wall of the hole 33 into a steep sidewall similarly to the first embodiment. In other words, it was possible to realize high accuracy processing capable of eliminating the dimensional difference between the bottom portion and the upper portion of the hole. It is also possible to similarly realize high accuracy processing even if the fourth projection ion beam is radiated while stopping the second projection ion beam.

In this case, when the microstructure is manufactured using the projection ion beams, the sample 11 is subjected to first hole etching processing by the first projection ion beam formed using the opening portion 51 of the stencil mask 4c. Afterward, the second projection ion beam smaller than the first projection ion beam in the magnitude of the skirt width S of the beam profile is formed. Furthermore, the set region (region formed by an opening at a width L2 in the opening portion 52 of FIG. 14) that includes not entirety of but part of the region processed by the first hole etching processing and that is wider than the region (region formed by an opening at the width L1 of the opening portion of FIG. 12, where L1<L2) radiated with the first projection ion beam is irradiated with the second projection ion beam to perform processing. In other words, according to the third embodiment, the fourth projection ion beam is not used to process all of four sides of a rectangle; however, it is possible to perform processing for simultaneously making the three sides steep.

As described so far, according to the first to third embodiments, it is possible to provide the microstructure manufacturing method capable of obtaining the sufficient processing speed and obtaining the sufficient processing accuracy when the microstructure is manufactured, for example, when the MEMS of the sensor, the actuator, the electronic circuit, and the like are manufactured using ion beams. Moreover, it is possible to realize the ion beam apparatus that mounts the ion source and that can manufacture the microstructure at the high speed with the high accuracy by irradiating the sample with the projection ion beam such as argon, krypton, xenon, nitrogen, or oxygen.

<The Present Invention Incorporating Contents of the Embodiments as Generic Concepts and Corresponding Effects>

It is noted, however, effects common to the aspects of the invention will not be repeatedly described.

(1) The present invention provides a microstructure manufacturing method using projection ion beams, includes a step (a) of irradiating a first region of a sample with a first ion beam formed by being passed through a first opening portion of a first mask, and etching the sample. The microstructure manufacturing method also includes a step (b) of, after the step (a), irradiating a second region that includes at least part of or entirety of the first region etched in the step (a) and that is wider than the first region in a direction along a beam width, with a second ion beam, and processing the sample. Furthermore, a magnitude of a skirt width of a longitudinal section of the second ion beam is smaller than a magnitude of a skirt width of a longitudinal section of the first ion beam.

It is thereby possible to provide the microstructure manufacturing method capable of obtaining the sufficient processing speed and obtaining the sufficient processing accuracy when the microstructure is manufactured, for example, when the MEMS of the sensor, the actuator, the electronic circuit, and the like are manufactured using ion beams.

(2) The present invention provides the microstructure manufacturing method set forth in (1), in which the second ion beam is an ion beam formed by being passed through a second opening portion of a second mask, the second mask having the second opening portion that has a larger area than an area of the first opening portion of the first mask and that is similar in shape to the first opening portion.

It is thereby possible to perform the hole etching processing such that the hole processed by the projection ion beams is steeply tilted in the entire outer circumferential portion of the hole. In other words, it is possible to reduce the dimensional difference between the upper portion and the lower portion of the opening portion of the hole. In addition, it is possible to provide the microstructure manufacturing method capable of suppressing the non-steepness of the corners of the opening portion and ensuring high accuracy.

(3) The present invention provides the microstructure manufacturing method set forth in (1), in which the second ion beam is an ion beam formed by being passed through a second opening portion of a second mask having a larger area than an area of the first opening portion of the first mask, a beam current of the second ion beam being lower than a beam current of the first ion beam.

It is thereby possible to provide the microstructure manufacturing method capable of highly accurate control over the etching depth albeit a reduction in the processing speed as a current of the second ion beam becomes lower.

(4) The present invention provides the microstructure manufacturing method set forth in (1), in which the step (b) includes a step of moving a height of a stage, which holds the sample, of the ion beam apparatus in a direction of being apart from an ion source, and irradiating the sample with the second ion beam to process the sample.

It is thereby possible to raise the projection magnification by moving the height of the stage in the direction of being apart from the ion source, and irradiate the set region wider than the region irradiated with the first ion beam, with the second ion beam with high accuracy. It is also possible to continuously adjust the projection magnification because the height of the stage can be continuously selected. As a result, it is possible to optimize the processing condition for the peripheral portion of the opening portion of the hole with high accuracy.

(5) The present invention provides the microstructure manufacturing method set forth in (1), in which the step (b) includes a step of moving a second mask having a second opening portion having a larger area than an area of the first opening portion of the first mask in a direction of being apart from an ion source, and irradiating the sample with the second ion beam to process the sample.

It is thereby possible to raise the projection magnification by moving the stencil mask in the direction of being apart from the ion source, and irradiate the set region wider than the region irradiated with the first ion beam, with the second ion beam with high accuracy. Furthermore, moving the stencil mask does not cause a great change in the projection magnification with respect to a moving distance. Owing to this, it is possible to perform fine adjustment of the projection magnification, and it is, therefore, possible to process the peripheral portion of the opening portion of the hole with high accuracy at the high speed.

(6) The present invention provides the microstructure manufacturing method set forth in (1), in which a processing dimension of the sample is matched to a design dimension of the microstructure in anticipation that a magnitude of a region of a processing trace is larger than a projection size when an ion beam is passed through the first opening portion of the first mask and then projected onto the sample at a desired projection magnification.

It is thereby possible to provide the microstructure manufacturing method capable of realizing high accuracy processing for the design dimension of the microstructure.

(7) The present invention provides the microstructure manufacturing method set forth in (1), in which the step (b) includes irradiating the sample with the second ion beam until a bottom portion of a hole portion formed by irradiation of the second ion beam becomes flat.

It is thereby possible to provide the microstructure manufacturing method suited for finishing the bottom portion of the etched hole to be flat.

(8) The present invention provides a microstructure manufacturing method using projection ion beams, includes a step (a) of irradiating a sample with a first ion beam formed by being passed through an opening portion of a third mask having the opening portion formed into a recessed polygon, and forming a region at a first depth and a region at a second depth smaller than the first depth in the sample. The microstructure manufacturing method also includes a step (b) of irradiating the region at the second depth with a second ion beam formed by being passed through an opening portion of a fourth mask, and processing the sample. Furthermore, the opening portion of the fourth mask is formed from part of a shape of the recessed polygon.

It is thereby possible to additionally, easily process a region in which an opening portion is small and a sufficient depth of a hole cannot be secured even when the magnitude of the opening portion of the hole varies depending on the processing region. It is, therefore, possible to perform processing to have a desired depth on the entire processing pattern. Furthermore, high speed processing can be realized, compared with a method of performing processing using opening portions of individual patterns of stencil masks depending on the magnitude of the opening portion.

(9) The present invention provides the microstructure manufacturing method set forth in (8), in which a magnitude of a skirt width of a longitudinal section of the second ion beam is smaller than a magnitude of a skirt width of a longitudinal section of the first ion beam.

It is thereby possible to provide the microstructure manufacturing method capable of realizing high accuracy processing in the region irradiated with the second ion beam.

(10) The present invention provides the microstructure manufacturing method set forth in (8), in which the region irradiated with the second ion beam has a portion larger than at least part of the region irradiated with the first ion beam.

It is thereby possible to perform the hole etching processing such that the region irradiated with the second ion beam is steeply tilted. In other words, the dimensional difference between the upper portion and the lower portion of the opening portion of the hole is reduced. In addition, it is possible to provide the microstructure manufacturing method capable of suppressing the non-steepness of the corners of the opening portion and ensuring high accuracy.

(11) The present invention provides an ion beam apparatus, including: an ion source; a plurality of lenses that focus an ion beam emitted from the ion source; a stage that holds a sample; and a mask that is disposed on the sample and that has an opening portion. The sample is irradiated with an ion beam formed by being passed through the opening portion of the mask to process the sample. Furthermore, the ion beam apparatus includes a control section that exercises first control for irradiating the sample with a first ion beam among ion beams to etch the sample, second control for forming a second ion beam having a magnitude of a skirt width of a longitudinal section smaller than a magnitude of a skirt width of a longitudinal section of the first ion beam, and third control for irradiating a region wider than a region irradiated with the first ion beam in a direction along a beam width, with the second ion beam to etch the sample.

It is thereby possible to provide the ion beam apparatus capable of obtaining the sufficient processing speed and obtaining the sufficient processing accuracy when the microstructure is manufactured, for example, when the MEMS of the sensor, the actuator, the electronic circuit, and the like are manufactured using ion beams.

(12) The present invention provides the ion beam apparatus set forth in (11), in which the opening portion is formed from a plurality of types of shapes, the plurality of types of shapes of the opening portion are similar, and the control section exercises control such that the first ion beam is formed by being passed through a first opening portion among the plurality of types of shapes of the opening portion, and that the second ion beam is formed by being passed through a second opening portion having a larger area than an area of the first opening portion.

It is thereby possible to perform the hole etching processing such that the hole processed by the projection ion beams is steeply tilted in the entire outer circumferential portion of the hole. In other words, the dimensional difference between the upper portion and the lower portion of the opening portion of the hole is reduced. In addition, the non-steepness of the corners of the opening portion is reduced. Moreover, it is possible to provide the ion beam apparatus capable of realizing high accuracy processing by forming the two types of projection ion beams by plane motion of the stencil mask.

(13) The present invention provides the ion beam apparatus set forth in (11), in which the opening portion is formed from a plurality of types of shapes, and the control section exercises control such that a beam current of the second ion beam formed by being passed through a second opening portion having a larger area than an area of a first opening portion among the plurality of types of shapes of the opening portion is set lower than a beam current of the first ion beam formed by being passed through the first opening portion.

It is thereby possible to provide the ion beam apparatus capable of highly accurate control over the etching depth albeit a reduction in the processing speed as a current of the second ion beam becomes lower.

(14) The present invention provides the ion beam apparatus set forth in (11), in which the control section exercises control such that a height of the stage when the second ion beam is formed is moved in a direction of being apart from the ion source, compared with a height of the stage when the first ion beam is formed.

It is thereby possible to raise the projection magnification by moving the height of the stage in the direction of being apart from the ion source, and irradiate the set region wider than the region irradiated with the first ion beam, with the second ion beam with high accuracy. It is also possible to continuously adjust the projection magnification because the height of the stage can be continuously selected. As a result, it is possible to provide the ion beam apparatus capable of optimizing the processing condition for the peripheral portion of the opening portion of the hole with high accuracy.

(15) The present invention provides the ion beam apparatus set forth in (11), in which the control section exercises control such that the sample is irradiated with the second ion beam until a bottom portion of a hole portion of the sample formed by being etched by the first ion beam becomes flat.

It is thereby possible to provide the ion beam apparatus suited for finishing the bottom portion of the hole to be flat by being etched.

While the invention made by the inventor of the present invention has been specifically described on the basis of the embodiments, the present invention is not limited to the embodiments described above but encompasses various modifications. For example, the abovementioned embodiments have been described in detail for describing the present invention so that the present invention is easy to understand. The present invention is not always limited to the examples having all the configurations described so far.

Furthermore, the configuration of a certain embodiment can be partially replaced by the configuration of the other embodiment or the configuration of the other embodiment can be added to the configuration of the certain embodiment. Moreover, for a part of the configuration of each embodiment, addition, deletion, and/or replacement of the other configuration can be made. It is noted that the members and relative sizes thereof shown in the drawings are simplified and idealized for describing the present invention so that the present invention is easy to understand; the members have more complicated shapes at a time of implementation.

While a case in which the three lenses are disposed in the ion beam irradiation system for scanning ion beams has been described in the ion beam apparatus described in the first embodiment, the number of lenses may be three or more.

What is claimed is:

1. A method of manufacturing a microstructure, comprising the steps of:
   (a) irradiating a first region of a sample with a first ion beam formed by being passed through a first opening portion of a first mask, and etching the sample; and
   (b) after the step (a), irradiating a second region that includes at least part of or entirety of the first region etched in the step (a) and that is wider than the first region in a direction along a beam width, with a second ion beam, and processing the sample, wherein
   a magnitude of a skirt width of a longitudinal section of the second ion beam is smaller than a magnitude of a skirt width of a longitudinal section of the first ion beam.

2. The method according to claim 1, wherein
the second ion beam is an ion beam formed by being passed through a second opening portion of a second mask, the second mask having the second opening portion, the second opening portion having a larger area than an area of the first opening portion of the first mask, the second opening portion being similar in shape to the first opening portion.

3. The method according to claim 1, wherein
the second ion beam is an ion beam formed by being passed through a second opening portion of a second mask having a larger area than an area of the first opening portion of the first mask, a beam current of the second ion beam being lower than a beam current of the first ion beam.

4. The method according to claim 1, wherein
the step (b) includes a step of moving a height of a stage, which holds the sample, of the ion beam apparatus in a direction of being apart from an ion source, and irradiating the sample with the second ion beam to process the sample.

5. The method according to claim 1, wherein
the step (b) includes a step of moving a second mask having a second opening portion having a larger area than an area of the first opening portion of the first mask in a direction of being apart from an ion source, and irradiating the sample with the second ion beam to process the sample.

6. The method according to claim 1, wherein
a processing dimension of the sample is matched to a design dimension of the microstructure in anticipation that a magnitude of a region of a processing trace is larger than a projection size when an ion beam is passed through the first opening portion of the first mask and then projected onto the sample at a desired projection magnification.

7. The method according to claim 1, wherein
the step (b) includes irradiating the sample with the second ion beam until a bottom portion of a hole portion formed by irradiation of the second ion beam becomes flat.

* * * * *